(12) United States Patent
Zheng et al.

(10) Patent No.: US 11,257,971 B2
(45) Date of Patent: Feb. 22, 2022

(54) SHINGLED PHOTOVOLTAIC MODULE WITH BYPASS DIODES

(71) Applicant: TAIZHOU LERRISOLAR TECHNOLOGY CO., LTD, Taizhou (CN)

(72) Inventors: Zhi Zheng, Shanghai (CN); Tao Xing, Shaanxi (CN); Ji Qi, Taizhou (CN); Shengbin Zhu, Taizhou (CN); Liangjie Shi, Taizhou (CN)

(73) Assignee: TAIZHOU LERRISOLAR TECHNOLOGY CO., LTD., Taizhou (CN)

( * ) Notice: Subject to any disclaimer, the term of this patent is extended or adjusted under 35 U.S.C. 154(b) by 251 days.

(21) Appl. No.: 16/475,689

(22) PCT Filed: Dec. 27, 2016

(86) PCT No.: PCT/CN2016/112471
§ 371 (c)(1),
(2) Date: Jul. 3, 2019

(87) PCT Pub. No.: WO2018/090445
PCT Pub. Date: May 24, 2018

(65) Prior Publication Data
US 2021/0135032 A1 May 6, 2021

(30) Foreign Application Priority Data
Nov. 21, 2016 (CN) .......................... 201611039613.1

(51) Int. Cl.
*H01L 31/05* (2014.01)
*H02S 40/34* (2014.01)
*H01L 31/068* (2012.01)

(52) U.S. Cl.
CPC ........ *H01L 31/0508* (2013.01); *H01L 31/068* (2013.01); *H02S 40/34* (2014.12)

(58) Field of Classification Search
CPC ..... H01L 31/0504–0516; H01L 31/042–0475; H01L 31/05–0516; H02S 40/30–38; H02S 40/36
See application file for complete search history.

(56) References Cited

U.S. PATENT DOCUMENTS

| 4,257,821 A | 3/1981 | Kelly et al. |
| 2008/0053511 A1* | 3/2008 | Nakamura .......... H01L 31/0201 136/244 |

(Continued)

FOREIGN PATENT DOCUMENTS

| CN | 201655820 U | 11/2010 |
| CN | 101997047 A | 3/2011 |

(Continued)

OTHER PUBLICATIONS

Machine translation of CN105097975A (Year: 2015).*
Machine translation of CN104868841A (Year: 2015).*

*Primary Examiner* — Eric R Smith
(74) *Attorney, Agent, or Firm* — Bayramoglu Law Offices LLC

(57) ABSTRACT

A shingled photovoltaic module with bypass diodes, includes four regions. Each region includes a plurality of cell strings consisting of crystalline silicon cells or crystalline silicon slice cells; the cell strings in the each region are connected in parallel with each other, and circuits between the regions are connected in series with each other; a first region and a second region are protected by one bypass diode, and a third region and a fourth region are protected by another bypass diode; the bypass diodes are positioned in a central part of the module; and positive electrode and negative electrode cables of the module are led out from a (Continued)

junction box which is located on a back side of the module and is close to an edge of the module.

12 Claims, 13 Drawing Sheets

(56) References Cited

U.S. PATENT DOCUMENTS

| | | | |
|---|---|---|---|
| 2010/0147364 A1* | 6/2010 | Gonzalez | H01L 31/0504 |
| | | | 136/251 |
| 2012/0266934 A1* | 10/2012 | Tang | H02S 40/34 |
| | | | 136/244 |
| 2015/0349161 A1* | 12/2015 | Morad | H01L 31/02008 |
| | | | 438/67 |
| 2016/0141435 A1 | 5/2016 | Sridhara et al. | |
| 2017/0162736 A1* | 6/2017 | Sethi | H01L 31/0512 |

FOREIGN PATENT DOCUMENTS

| | | |
|---|---|---|
| CN | 102522442 A | 6/2012 |
| CN | 203339197 U | 12/2013 |
| CN | 104505412 A | 4/2015 |
| CN | 104868841 A | 8/2015 |
| CN | 105097975 A | 11/2015 |

\* cited by examiner

SHINGLED PHOTOVOLTAIC MODULE WITH BYPASS DIODES

CROSS REFERENCE TO THE RELATED APPLICATIONS

This application is the national phase entry of International Application No. PCT/CN2016/112471, filed on Dec. 27, 2016, which claims priority from Chinese Patent Application 201611039613.1, filed on Nov. 21, 2016, the entire contents of which are incorporated herein by reference.

TECHNICAL FIELD

The present invention relates to the field of photovoltaic module technologies, and more particularly, to a shingled photovoltaic module.

BACKGROUND

Solar cells refer to devices that can directly convert light energy into direct current using photovoltaic effect. According to different photoelectric conversion materials, the solar cells include monocrystalline silicon, polycrystalline silicon, amorphous silicon film, cadmium telluride film, copper indium gallium tin film, gallium arsenide, fuel sensitization, perovskite, III-V multi junction cells, and other types. The crystalline silicon solar cells are the most common solar cells, including monocrystalline silicon solar cells and polycrystalline silicon solar cells A photovoltaic device that can be used for long-term use by electrically interconnecting a plurality of solar cells is called a photovoltaic module. A common method of interconnecting the solar cells in the crystalline silicon photovoltaic module is to arrange the solar cells in sequence, use a tin-coated solder strip containing a copper substrate as an interconnecting strip, weld the interconnecting strip on a bus bar in a front side of a first solar cell, and weld the other end of the interconnecting strip on a bus bar in a back side of an adjacent second solar cell. The two ends of a second interconnecting strip are respectively welded on a bus bar in a front side of the second solar cell and a bus bar in a back side of a third solar cell, and so on. In this way, all the solar cells are connected in series into one string.

A shingled module employs another technique for interconnecting cell slices. One side of a cell slice A is placed under another cell slice B, so that a bus bar electrode in a front side of the cell slice A and a bus bar electrode in a back side of the cell slice B are overlapped with each other. The two electrodes are physically connected and conductively connected by using a conductive adhesive, a solder strip or a solder paste, etc.

Referring to FIG. 1, the conventional shingled module without bypass diodes may have thermal spots on the module if the shingled module is shaded (for example, snow, and severe dirt), causing damage or even burning of the module. Referring to FIG. 2, the conventional shingled module with bypass diodes has only one bypass diode. Since a voltage of the module exceeds a reverse breakdown voltage of a single cell slice, in the case of hot spots, the cell slice that generates the hot spots is reversely broken down, while the bypass diode does not work, which also causes damage or even burning of the module.

SUMMARY

An object of the present invention is to provide a shingled photovoltaic module with bypass diodes to solve the above technical problems.

In order to achieve the above object, the following technical solution is employed in the present invention.

A shingled photovoltaic module with bypass diodes includes a first region, a second region, a third region, and a fourth region, wherein the four regions are arranged in a four-square shape; each region contains a plurality of solar cell strings consisting of crystalline silicon solar cells or crystalline silicon solar slice cells overlapped end to end; all the cell strings in each region are connected in parallel; and positive electrodes of the cell strings are connected to each other, and negative electrodes of the cell strings are connected to each other;

positive electrodes of the cell strings in the first region serve as a positive electrode of the entire module, and negative electrodes of the cell strings in the first region are communicated with positive electrodes of the cell strings in the second region; negative electrodes of the cell strings in the second region are communicated with positive electrodes of the cell strings in the third region; negative electrodes of the cell strings in the third region are communicated with positive electrodes of the cell strings in the fourth region; and negative electrodes of the cell strings in the fourth region serve as a negative electrode of the entire module; and a bypass diode D1 is arranged between the positive electrodes of the cell strings in the first region and the negative electrodes of the cell strings in the second region, a positive electrode of the bypass diode D1 is connected with the negative electrodes of the cell strings in the second region, and a negative electrode of the bypass diode D1 is connected with the positive electrodes of the cell strings in the first region; a bypass diode D2 is arranged between the positive electrodes of the cell strings in the third region and the negative electrodes of the cell strings in the fourth region, a negative electrode of the bypass diode D2 is connected with the positive electrodes of the cell strings in the third region, and a positive electrode of the bypass diode D2 is connected with the negative electrodes of the cell strings in the fourth region; and the bypass diode D1 and the bypass diode D2 are located in a middle of the entire module.

Further, each region includes N solar cell strings, N is a positive integer, and 1≤N≤8; a total number of solar cells in each cell string is M, M is a positive integer, 5≤M≤50; and the cells in the same cell string have the same specifications.

Further, the solar cells constituting the cell strings are complete pieces of monocrystalline silicon or polycrystalline silicon solar cells, or small cell slices cut from a complete piece of solar cell.

Further, a first junction box is arranged between the first region and the fourth region on a back side of the module close to an edge of the module, and positive electrode and negative electrode cables of the entire module are led out from the first junction box.

Further, a second junction box is arranged in a middle region among the first region, the second region, the third region and the fourth region at the back side of the module, and the bypass diode D1 and the bypass diode D2 are arranged in the second junction box; or the second junction box and a third junction box are arranged in the middle region among the first region, the second region, the third region and the fourth region at the back side of the module, the bypass diode D1 is arranged in the second junction box, and the bypass diode D2 is arranged in the third junction box.

Further, the bypass diode D1 and the bypass diode D2 are embedded in upper and lower insulating packaging materials of the module, or arranged between the packaging material and a back plate, between the packaging material and a front plate, or between the packaging material and a cell slice.

Further, the packaging material is an ethylene-vinyl acetate copolymer or a polyolefin.

Further, a negative electrode of the first region and a positive electrode of the second region are electrically connected with a first string connector through a metallic or alloy solder strip; a negative electrode of the second region and a positive electrode of the third region are electrically connected with a second string connector through a solder strip; a negative electrode of the third region and a positive electrode of the fourth region are electrically connected with a third string connector through a solder strip; a negative electrode of the fourth region is electrically connected with a fourth string connector through a solder strip; a positive electrode of the first region is electrically connected with a fifth string connector through a solder strip; the string connector is made of metal or alloy; the fourth string connector and the fifth string connector are laminated and separated by an insulating film in the middle; or, the fourth string connector and the fifth string connector are arranged side by side, and a gap therebetween is filled with an insulating packaging material.

Further, the insulating film is made of a polyethylene glycol terephthalate film or a polyamide.

Further, the insulating packaging material is an ethylene-vinyl acetate copolymer or a polyolefin.

Further, a negative electrode of the first region is electrically connected with a positive electrode of the second region through a flexible conductive tape directly; a negative electrode of the second region is electrically connected with a positive electrode of the third region through a flexible conductive tape directly; and a negative electrode of the third region is electrically connected with a positive electrode of the fourth region through a flexible conductive tape directly.

Further, the negative electrodes of each cell string in the fourth region are connected through a second conductive layer of a double-sided flexible conductive tape, the positive electrodes of each cell string in the first region are connected by a first conductive layer of the double-sided conductive tape, and the first conductive layer and the second conductive layer are isolated and insulated by an intermediate insulating layer; and the first conductive layer and the second conductive layer respectively cover an upper surface and a lower surface of the entire intermediate insulating layer; or, the first conductive layer and the second conductive layer respectively cover a part of the upper surface and a part of the lower surface of the intermediate insulating layer.

Further, the intermediate insulating layer is made of a polyethylene glycol terephthalate.

Further, the negative electrodes of each cell string in the fourth region are connected through a second conductor of a double-sided flexible conductive tape, the positive electrodes of each cell string in the first region are connected through a first conductor of the double-sided conductive tape, and the first conductor and the second conductor are isolated and insulated by an intermediate insulator; and the intermediate insulator is made of a polyethylene glycol terephthalate.

Compared with the prior art, the present invention has the following advantageous effects. According to the present invention, the module is divided into four regions, the cell strings in each region are connected in parallel, and the circuits between the regions are connected in series. The first region and the second region are protected by one bypass diode, and the third region and the fourth region are protected by another bypass diode. The bypass diodes are located in the central part at the back of the module. The positive electrode and negative electrode cables of the module are led out from the junction box which is located on the back side of the module and close to the edge of the module. In the present invention, the overall voltage of the 2*N cell strings connected with the bypass diodes in parallel is half of the voltage of the entire module. Compared with the solution of not employing the bypass diodes or connecting on bypass diode on the positive electrode and negative electrode of the entire module in parallel, the solution of the present invention reduces the risk of hot spots.

Further, the positive electrode and negative electrode cables of the module are led out by the junction box located on the back side and close to the middle of the edge, which is similar to conventional modules, and is convenient for installation and application.

BRIEF DESCRIPTION OF THE DRAWINGS

FIG. 4A-1 is an enlarged view illustrating a connection of cell strings in the second region shown in FIG. 4 with the first string connector 11 and the first string connector branch 110;

FIG. 4C-1 is an enlarged view illustrating a connection of the cell strings in the fourth region shown in FIG. 4 with the third string connector 13 and the third string connector branch 130;

FIG. 11A-1 is an enlarged view illustrating a connection of cell strings in the second region shown in FIG. 11 with the flexible conductive tape 32;

FIG. 11C-1 is an enlarged view illustrating a connection of cell strings in the fourth region shown in FIG. 11 with the flexible conductive tape 33;

DETAILED DESCRIPTION

Figure 1:
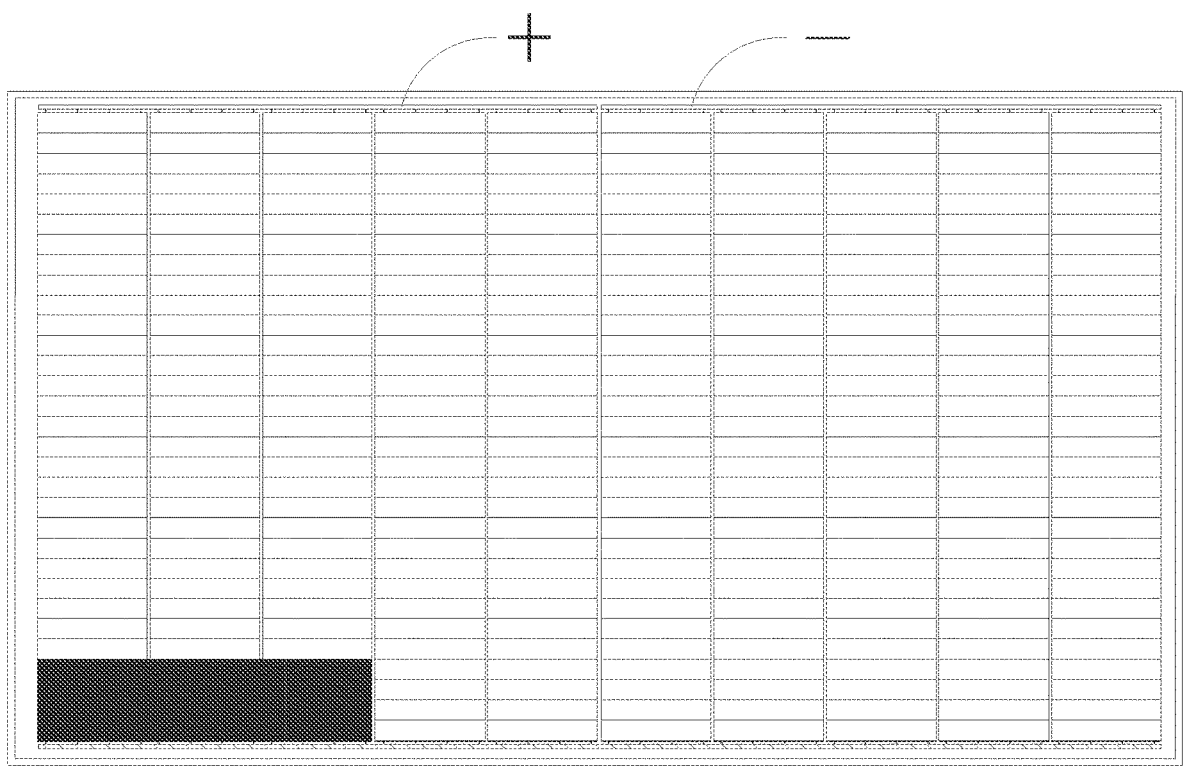
FIG. 1 is a schematic structure diagram of a conventional shingled photovoltaic module without bypass diodes.
Figure 2:
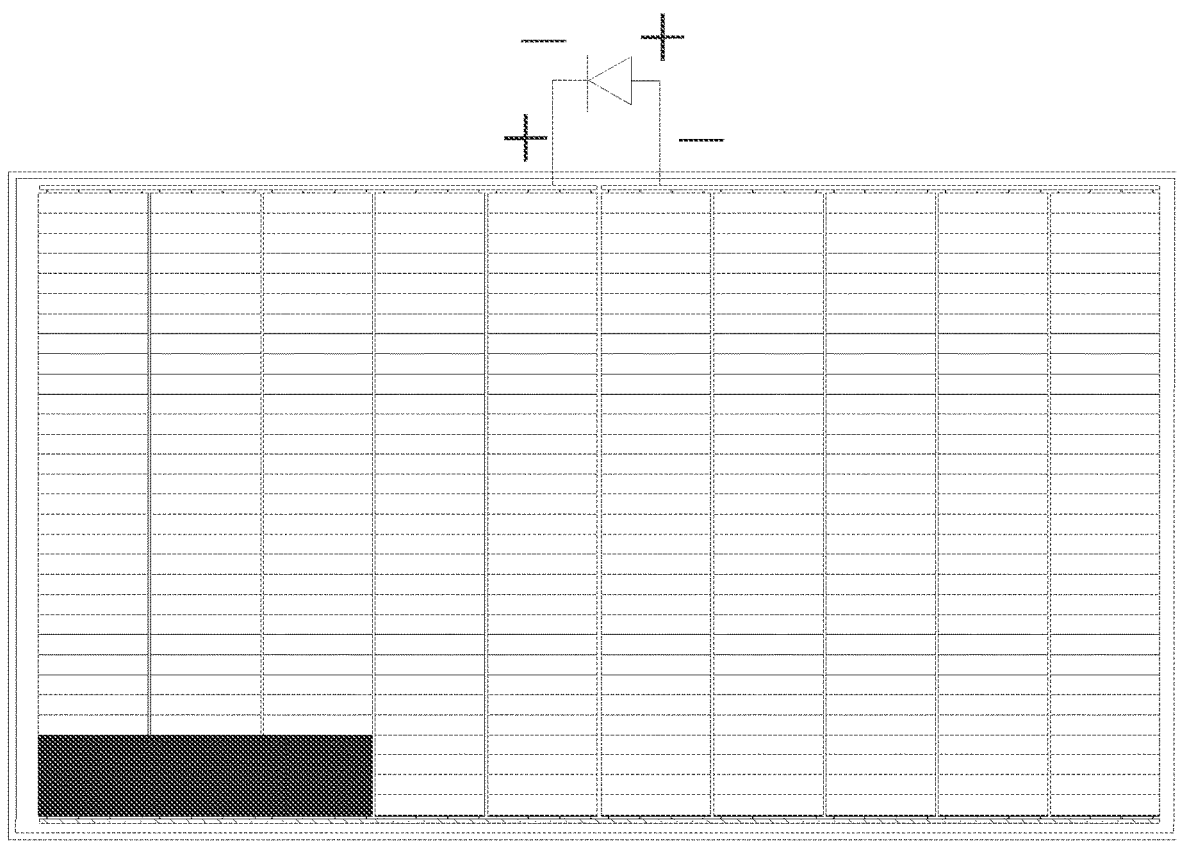
FIG. 2 is a schematic structure diagram of a conventional shingled photovoltaic module with one bypass diode.
Figure 3:
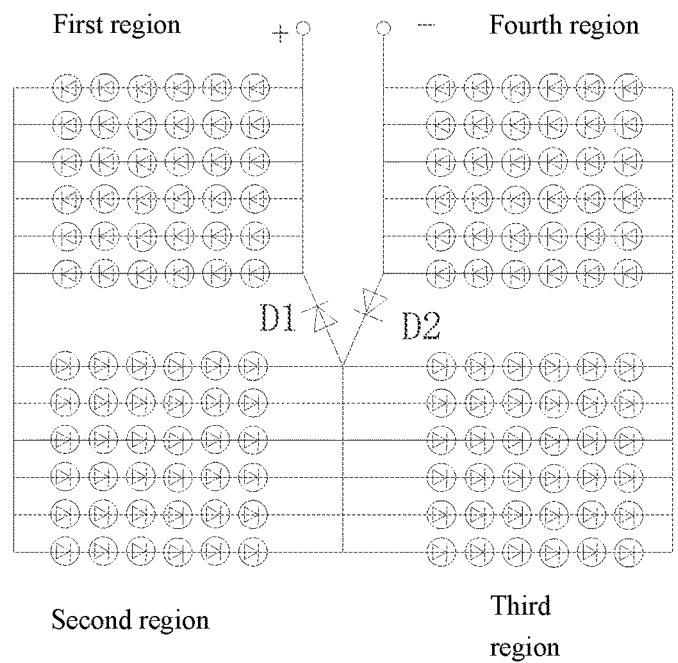
FIG. 3 is a schematic circuit diagram of a shingled photovoltaic module with bypass diodes according to an embodiment of the present invention.

Referring to FIG. 3, a shingled photovoltaic module with bypass diodes according to the present invention is divided into four regions, wherein each region contains N solar cell strings consisting of crystalline silicon solar cells or crystalline silicon solar slice cells, and $1 \leq N \leq 8$. Solar cell slices in each cell string have the same area and specifications, and a total number of the cell slices 100 in each cell string is M (M is an integer, and $5 \leq M \leq 50$). Positive electrodes of all the cell strings in each region are mutually communicated, and negative electrodes of all the cell strings in each region are mutually communicated. The cell slices constituting the cell strings may either be complete pieces of monocrystalline silicon or polycrystalline silicon cells, or small cell slices cut into a size equal to one third, one fourth, one fifth, one sixth of the complete piece of cell slice or other sizes.

Positive electrodes of the cell strings in the first region serve as a positive electrode of the entire module, and negative electrodes of the cell strings in the first region are communicated with positive electrodes of the cell strings in the second region. Negative electrodes of the cell strings in the second region are communicated with positive electrodes of the cell strings in the third region. Negative electrodes of the cell strings in the third region are communicated with positive electrodes of the cell strings in the fourth region. Negative electrodes of the cell strings in the fourth region serve as a negative electrode of the entire module. A bypass diode D1 is arranged between the positive electrodes of the cell strings in the first region and the negative electrodes of the cell strings in the second region, a positive electrode of the bypass diode D1 is connected with the negative electrodes of the cell strings in the second region, and a negative electrode of the bypass diode D1 is connected with the positive electrodes of the cell strings in the first region. A bypass diode D2 is arranged between the positive electrodes of the cell strings in the third region and the negative electrodes of the cell strings in the fourth region, a negative electrode of the bypass diode D2 is connected with the positive electrodes of the cell strings in the third region, and a positive electrode of the bypass diode D2 is connected with the negative electrodes of the cell strings in the fourth region. With this design, a voltage of a circuit formed by the first region and the second region is half of that of the entire module, and a voltage of a circuit formed by the third region and the fourth region is also half of that of the entire module. Compared with the solution of not employing the bypass diodes or connecting on bypass diode on the positive electrode and negative electrode of the entire module in parallel, this solution reduces the risk of hot spots.

Figure 4:
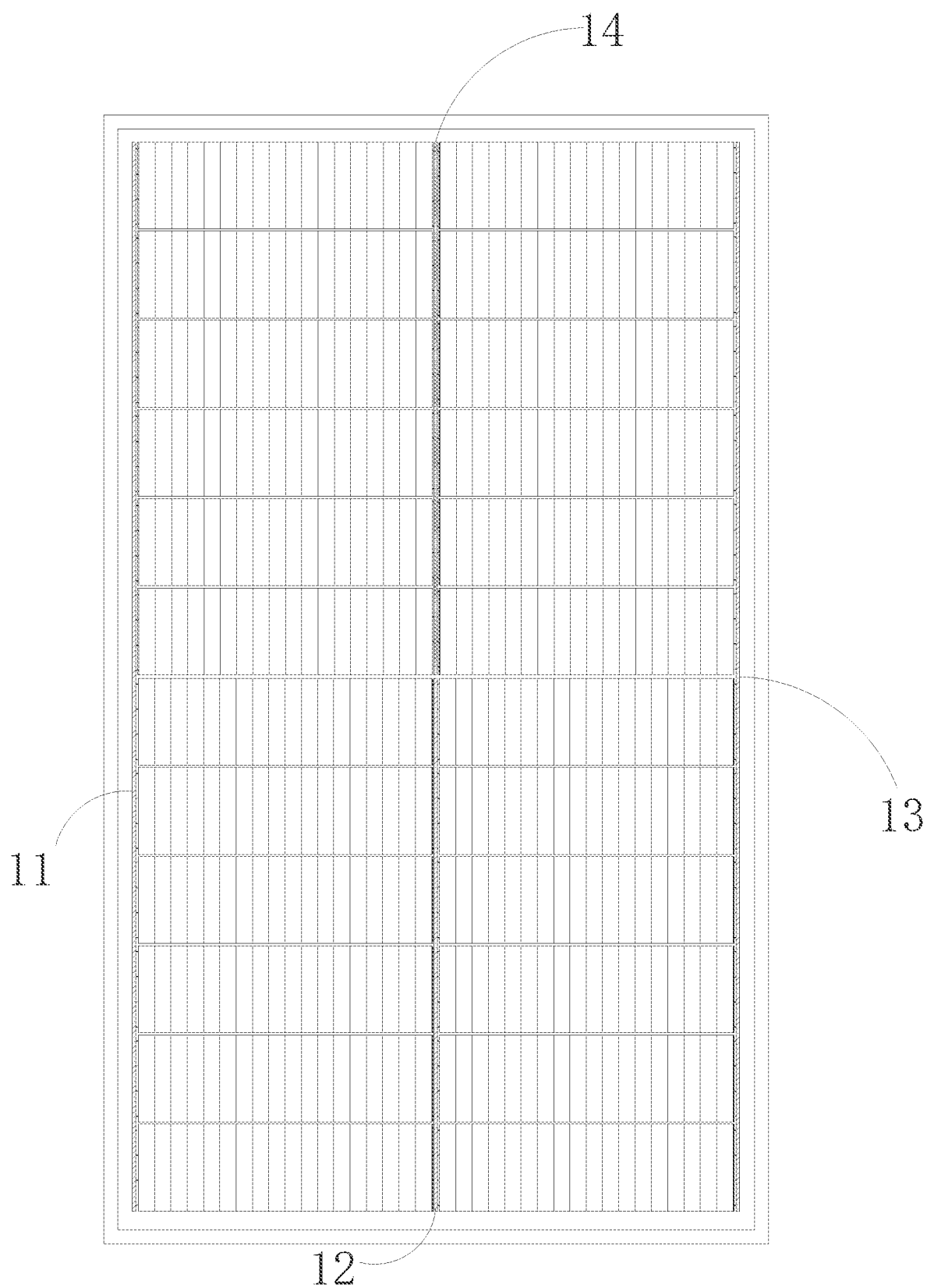
FIG. 4 is an exemplary diagram of a shingled photovoltaic module with bypass diodes according to an embodiment of the present invention, wherein M=18, and N=6.
Figure 4A:
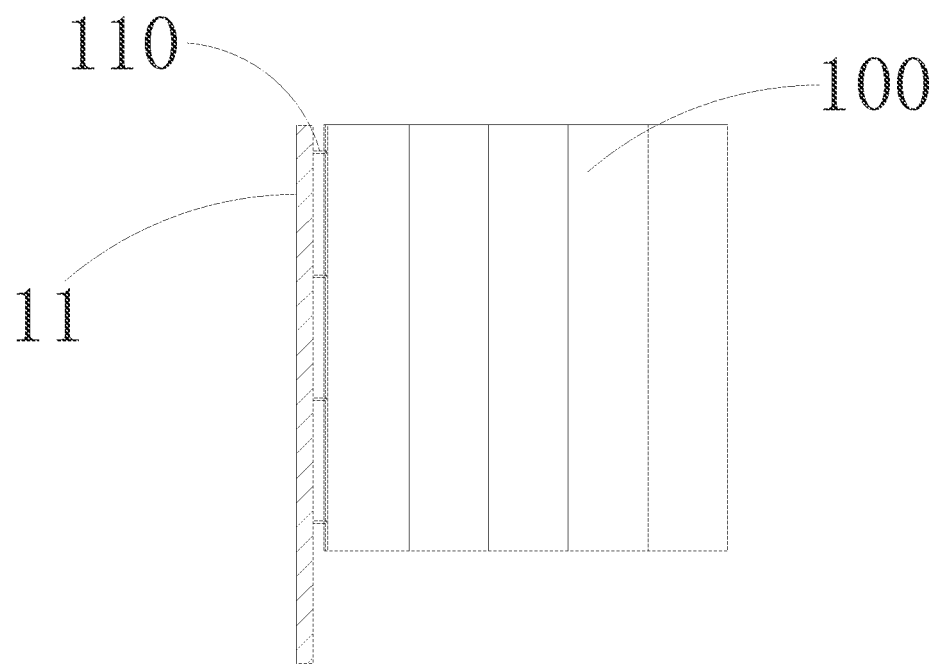
FIG. 4A is an enlarged view illustrating a connection of cell strings in the first region shown in FIG. 4 with a first string connector 11 and a first string connector branch 110.
Figures 1, 4A:
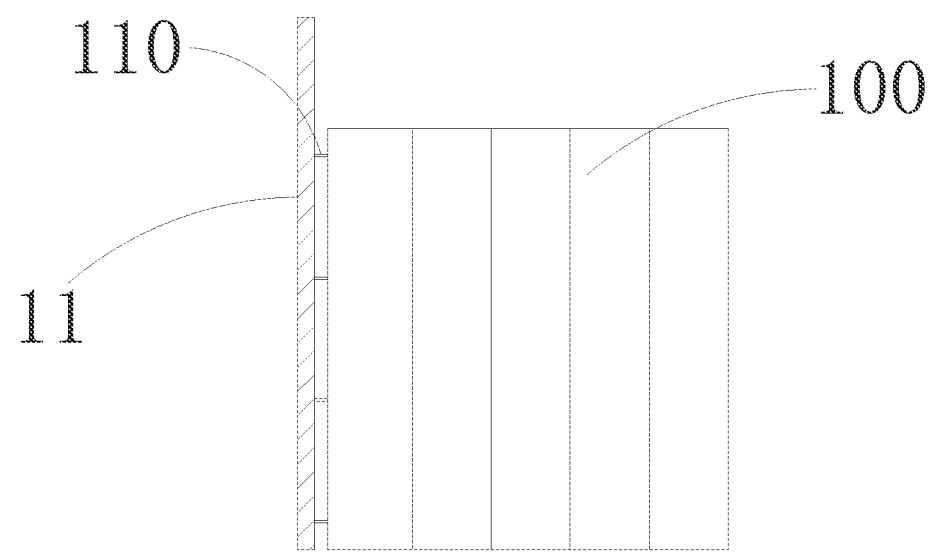
Figure 4B:
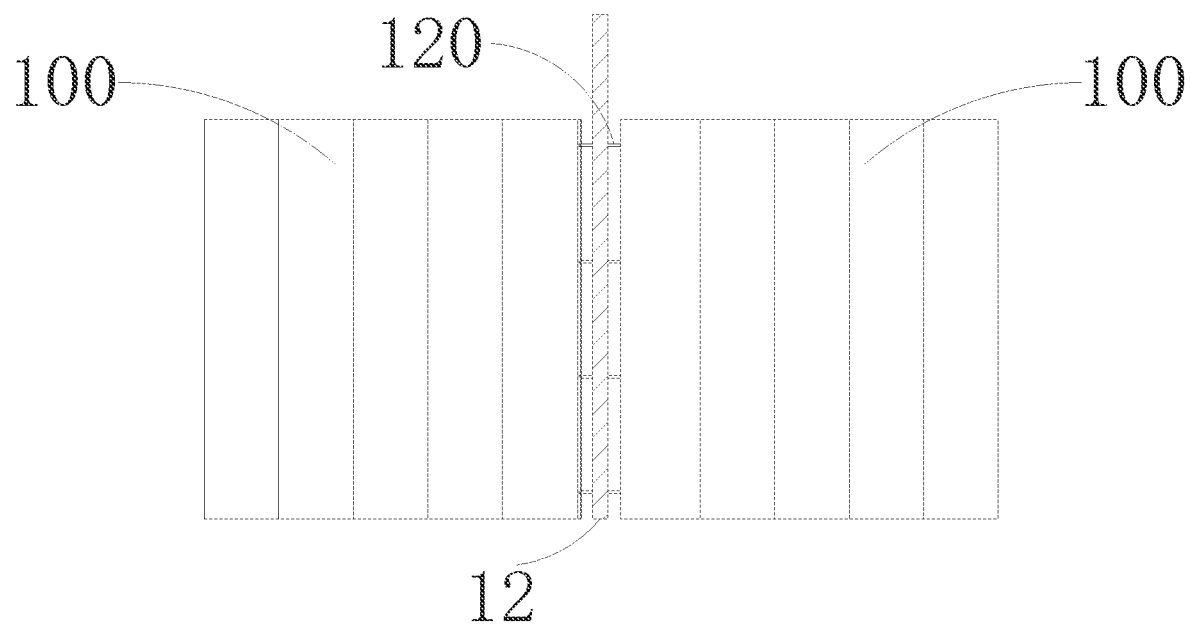
FIG. 4B is an enlarged view illustrating a connection of cell strings in the second and third regions shown in FIG. 4 with a second string connector 12 and a second string connector branch 120.
Figure 4C:
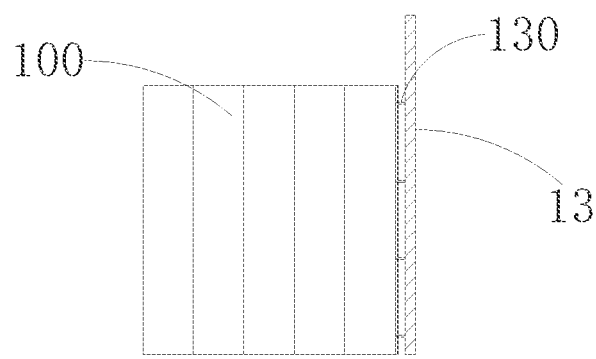
FIG. 4C is an enlarged view illustrating a connection of the cell strings in the third region shown in FIG. 4 with a third string connector 13 and a third string connector branch 130.
Figures 1, 4C:
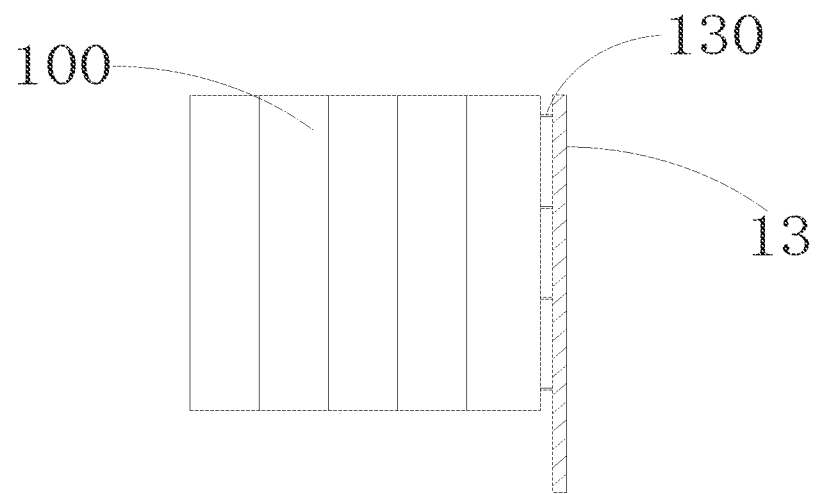
Figure 4D:
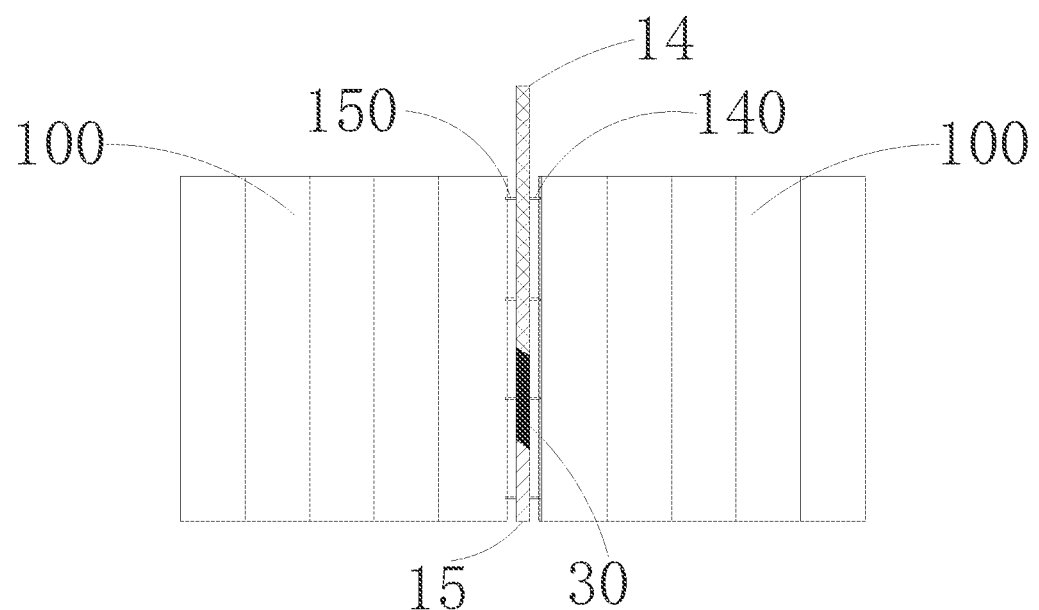
FIG. 4D is an enlarged view illustrating a connection of the cell strings in the third and fourth region shown in FIG. 4 with a fourth string connector 14 and a fifth string connector 15, wherein the fourth string connector 14 is connected with the cell strings in the fourth region through a fourth string connector branch 140, and the fifth string connector 15 is connected with the cell strings in the first region through a fifth string connector branch 150; and the fourth string connector 14 and the fifth string connector 15 are overlapped, and are separated by an insulating strip 30 therebetween.

Referring to FIG. 4, a specific embodiment of the present invention is a shingled photovoltaic module with bypass diodes, employing monocrystalline silicon cell slices, wherein M=18, and N=6.

Figure 5:
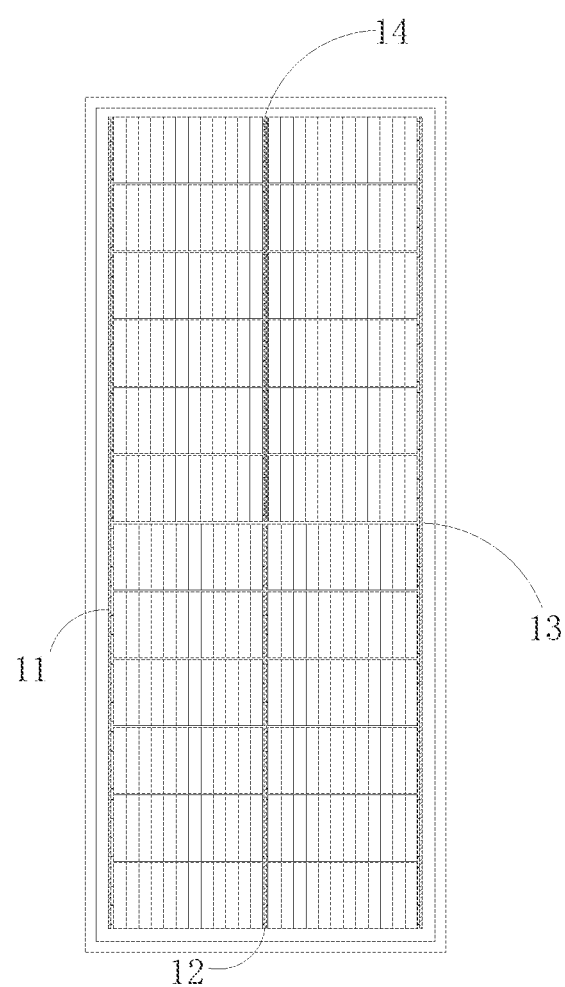
FIG. 5 is an exemplary diagram of a shingled photovoltaic module with bypass diodes according to an embodiment of the present invention, wherein M=12, and N=6.

Referring to FIG. 5, a specific embodiment of the present invention is a shingled photovoltaic module with bypass diodes, employing polycrystalline silicon cell slices, wherein M=12, and N=6.

Figure 6:
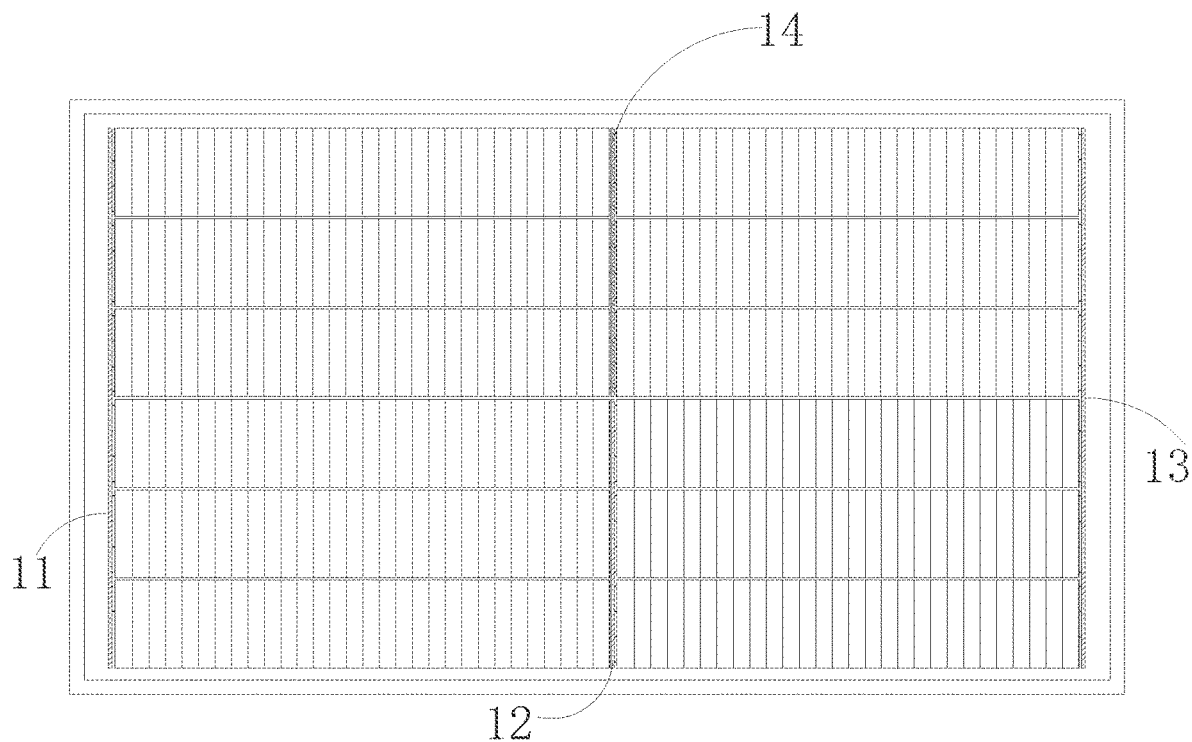
FIG. 6 is an exemplary diagram of a shingled photovoltaic module with bypass diodes according to an embodiment of the present invention, wherein M=30, and N=3.

Referring to FIG. 6, a specific embodiment of the present invention is a shingled photovoltaic module with bypass diodes, employing n-type heterojunction cell silicon slices, wherein M=30, and N=3.

Figure 7:
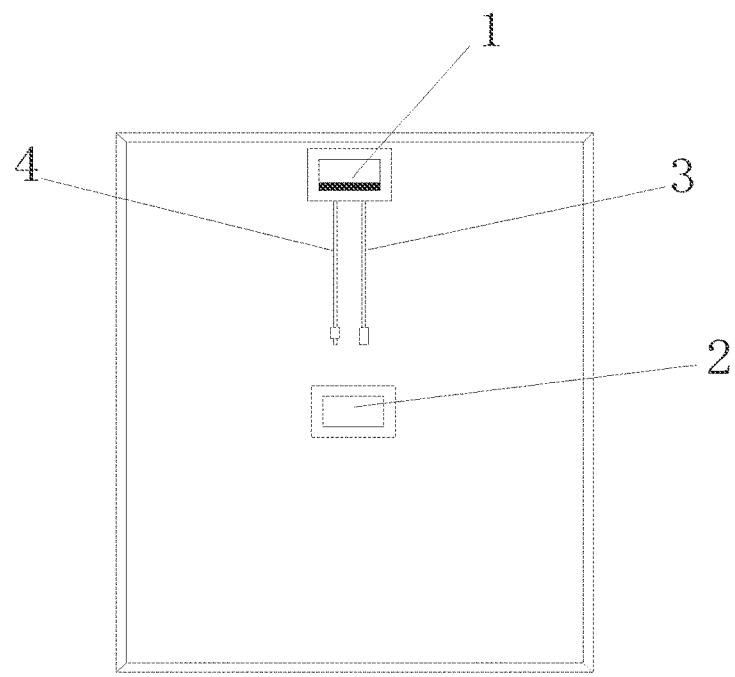
FIG. 7 is a back schematic view of a photovoltaic module with two junction boxes according to an embodiment of the present invention.

FIG. 7 illustrates a back schematic view of a photovoltaic module designed according to the present invention, wherein two junction boxes are used in total. Two bypass diodes are provided in a second junction box at a center of a back side of the module. No diode is provided in a first junction box at the back side of the module close to an edge of the module, but positive electrode and negative electrode cables 3, 4 of the module are led out from the first junction box.

Figure 8:
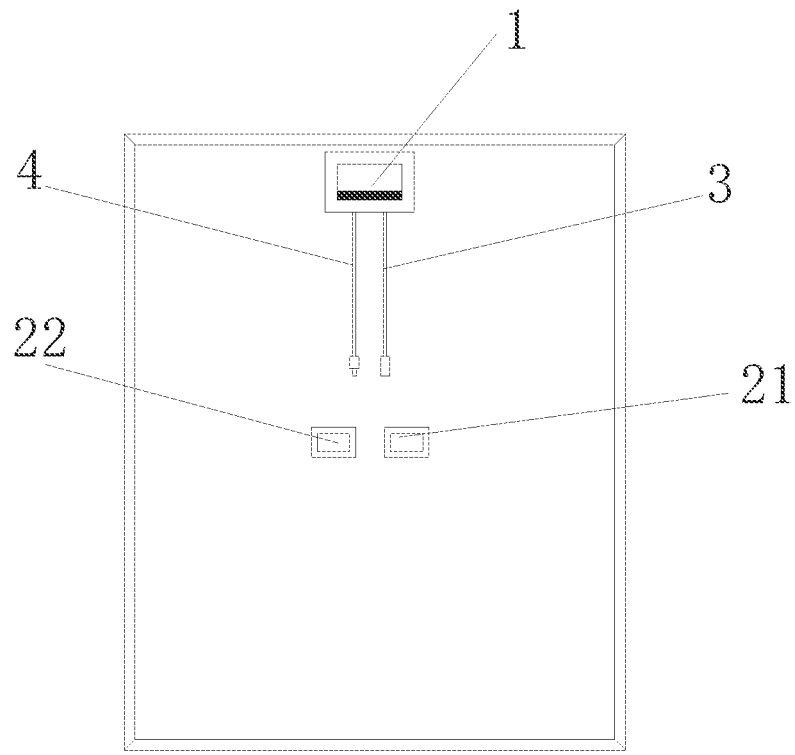
FIG. 8 is a back schematic view of a photovoltaic module with three junction boxes according to an embodiment of the present invention.

FIG. 8 illustrates a back schematic view of a photovoltaic module designed according to the present invention, wherein three junction boxes are used in total. One bypass diode is respectively provided in each of two junction boxes 21, 22 located at a center of a back side of the module. No diode is provided in a first junction box at the back side of the module close to an edge of the module, but positive electrode and negative electrode cables 3, 4 of the module are led out from the first junction box.

Figure 9:
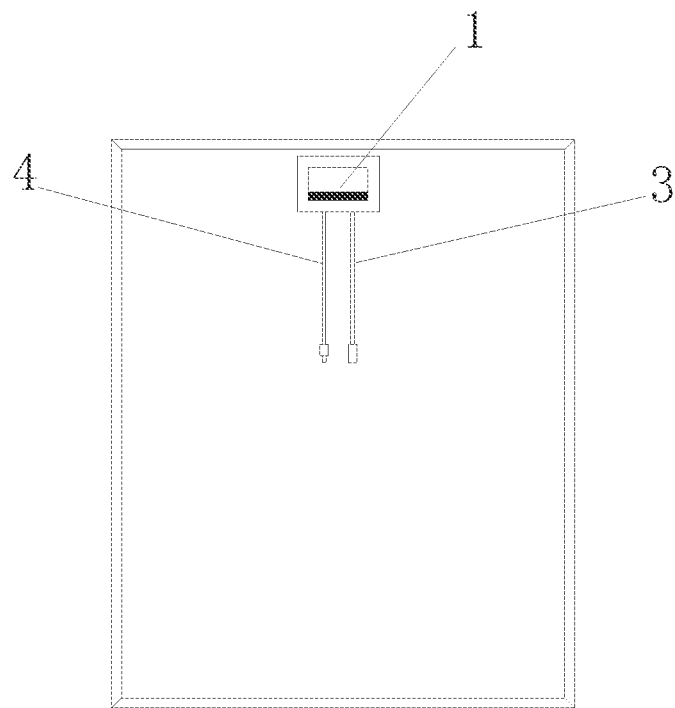
FIG. 9 is a back schematic view of a photovoltaic module with one junction box according to an embodiment of the present invention.

FIG. 9 illustrates a back schematic view of a photovoltaic module designed according to the present invention, wherein one junction box is used in total. No junction box is provided in a center of a back side of the module, and two bypass diodes are buried directly inside the module. The two bypass diodes are located between two layers of packaging materials and the packaging material is an ethylene-vinyl acetate copolymer. No diode is provided in the junction box at the back side of the module close to an edge of the module, but positive electrode and negative electrode cables 3, 4 of the module are led out from the first junction box.

Figure 10:
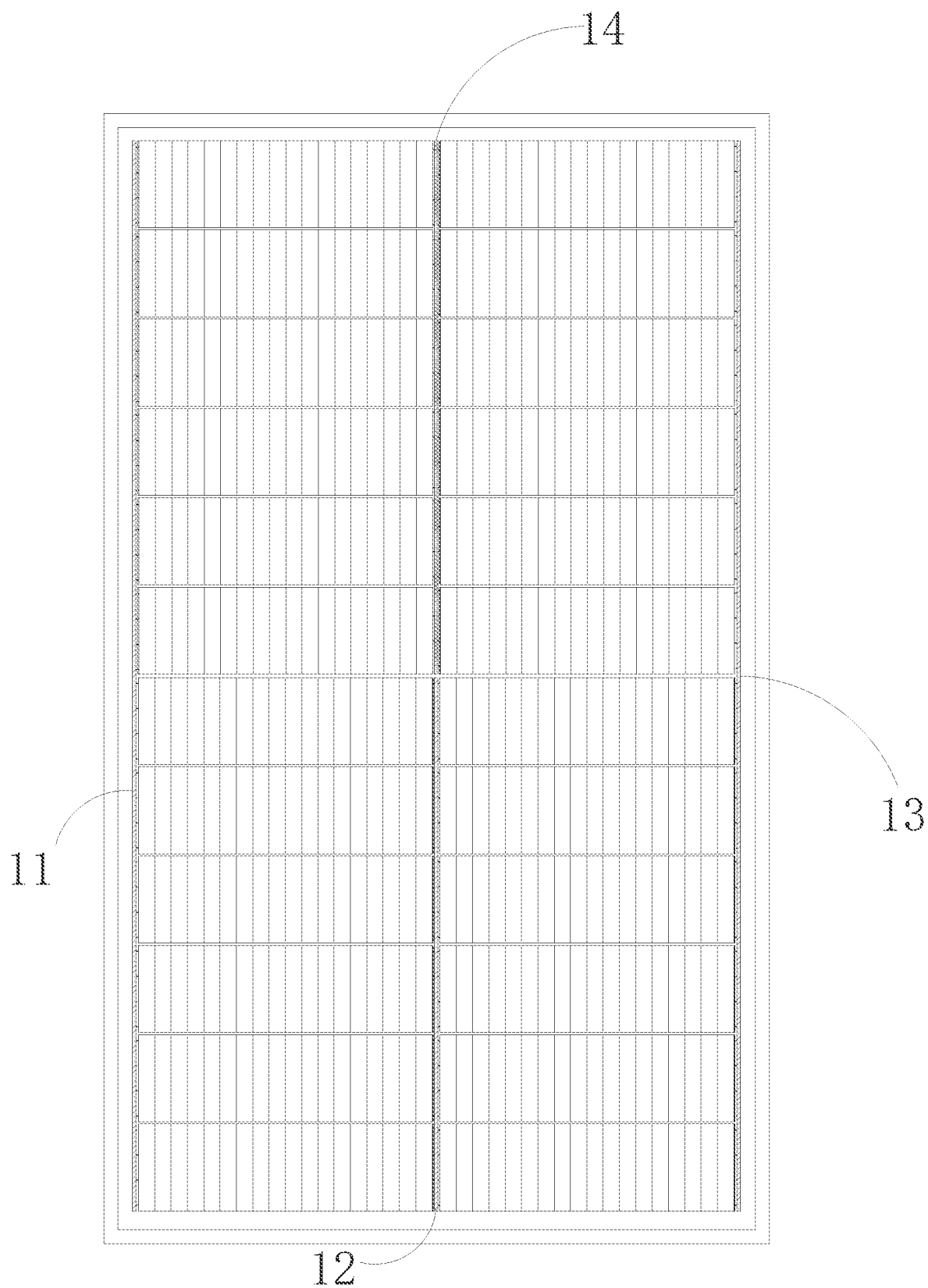
FIG. 10 is a front schematic view of a shingled module designed according to an embodiment of the present invention.
Figure 12:
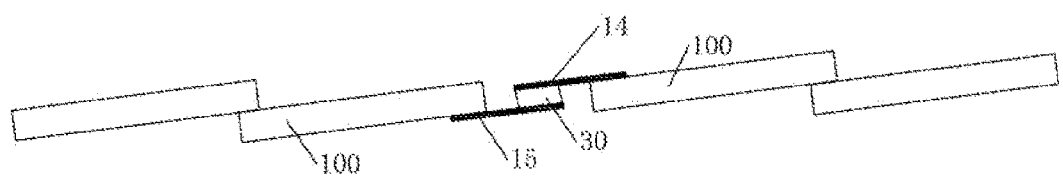
FIG. 12 is a side view of a string connector arrangement structure between the first region and the fourth region according to an embodiment of the present invention.
Figure 13:
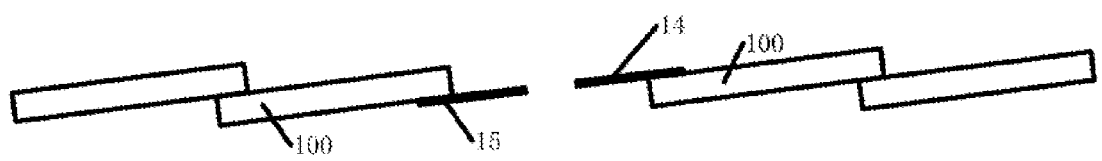
FIG. 13 is a side view of another string connector arrangement structure between the first region and the fourth region according to an embodiment of the present invention.
Figure 14:
FIG. 14 is a side view of a string connector arrangement structure between the second region and the third region according to an embodiment of the present invention.

FIG. 10 illustrates a front schematic view of a shingled module designed according to the present invention. A negative electrode of a first region and a positive electrode of a second region are electrically connected with a first string connector 11 through a solder strip. A negative electrode of the second region and a positive electrode of a third region are electrically connected with a second string connector 12 through a solder strip. A negative electrode of the third region and a positive electrode of a fourth region are electrically connected with a third string connector 13 through a solder strip. A negative electrode of the fourth region is electrically connected with a fourth string connector 14 through a solder strip. A positive electrode of the first region is electrically connected with a fifth string connector 15 through a solder strip. The fourth string connector 14 and the fifth string connector 15 can be laminated side by side and separated by an insulating strip 30 therebetween, as shown in FIG. 10 and FIG. 12. The fourth string connector 14 and the fifth string connector 15 can be arranged side by side, and a gap therebetween is filled with an insulating packaging material such as an ethylene-vinyl acetate copolymer, as shown in FIG. 13. Two sides of the second string connector 12 are electrically connected with the positive electrode of the second region and the positive electrode of the third region through a solder strip 31, as shown in FIG. 14.

Figure 11:
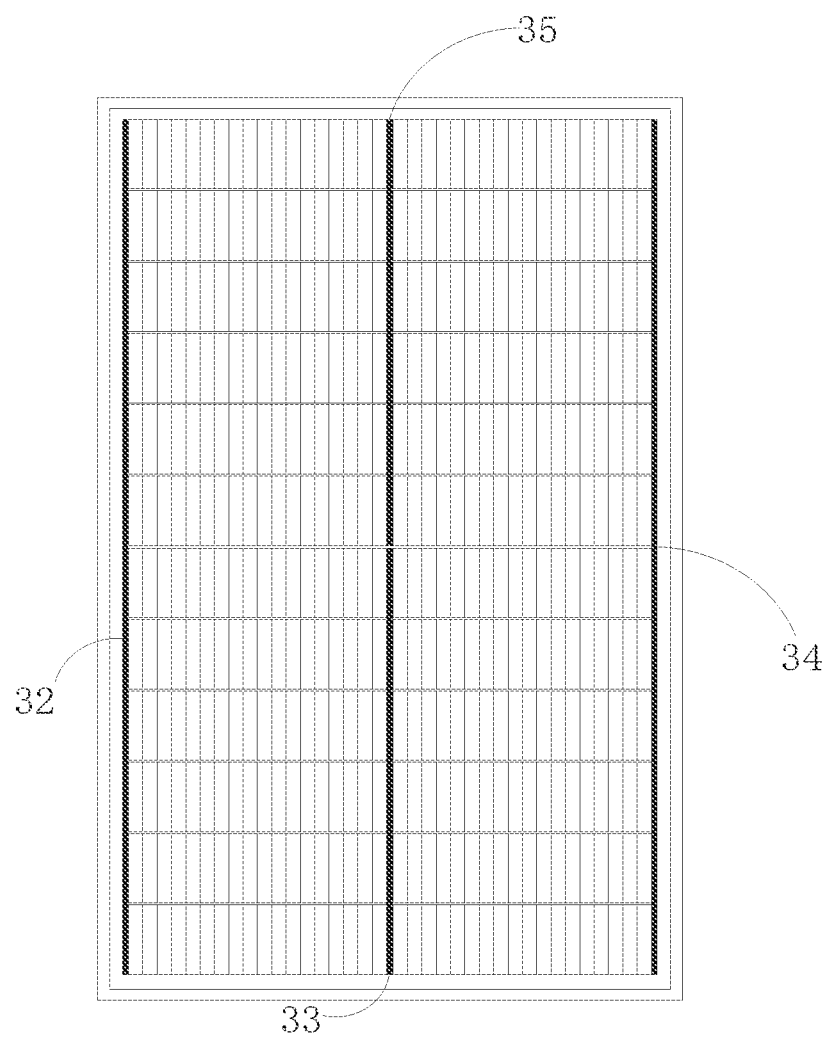
FIG. 11 is a front schematic view of another shingled module designed according to an embodiment of the present invention.
Figure 11A:
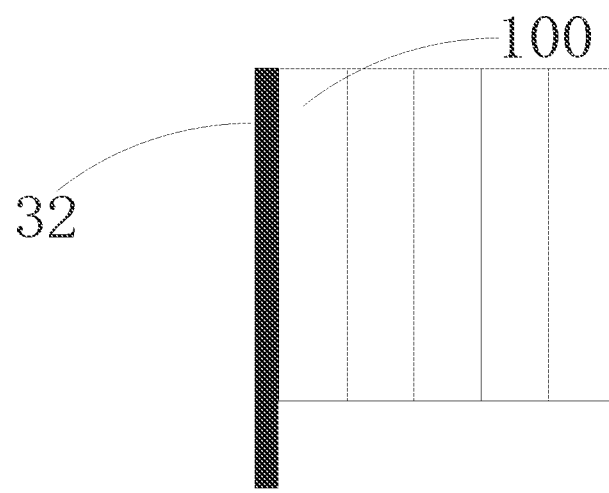
FIG. 11A is an enlarged view illustrating a connection of cell strings in the first region shown in FIG. 11 with a flexible conductive tape 32.
Figures 1, 11A:
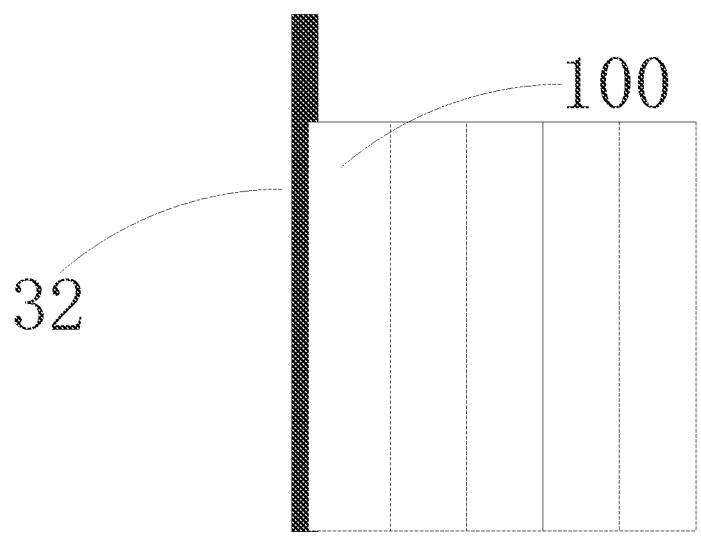
Figure 11B:
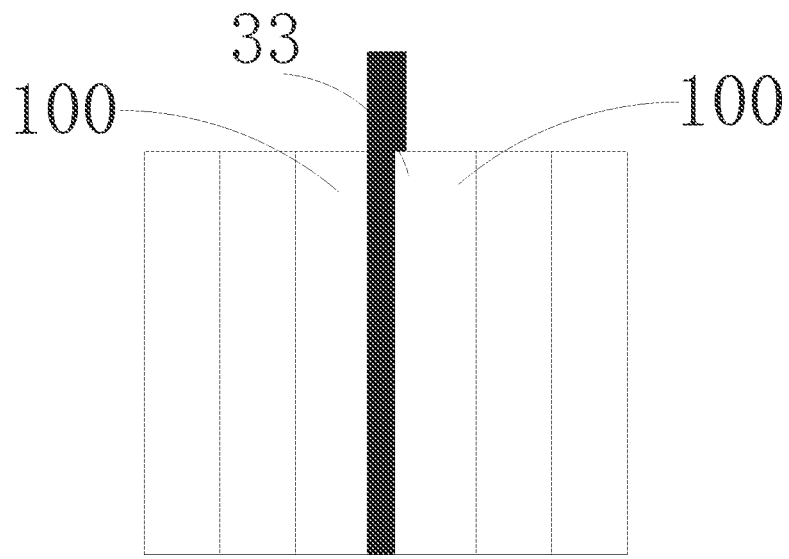
FIG. 11B is an enlarged view illustrating a connection of cell strings in the second and third regions shown in FIG. 11 with a flexible conductive tape 33.
Figure 11C:
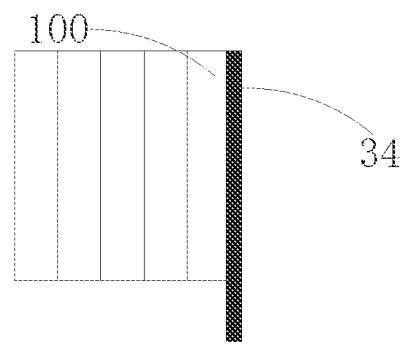
FIG. 11C is an enlarged view illustrating a connection of the cell strings in the third region shown in FIG. 11 with the flexible conductive tape 33.
Figures 1, 11C:
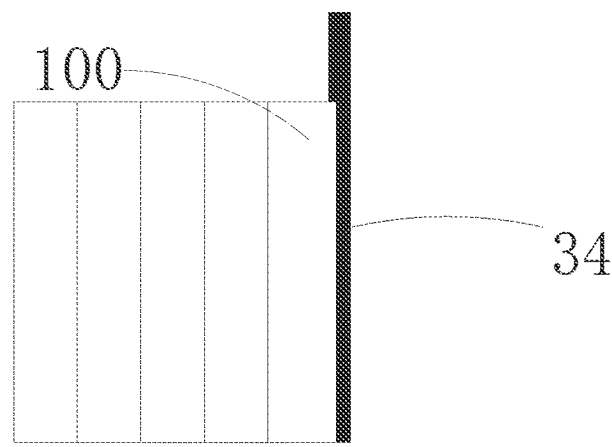
Figure 11D:
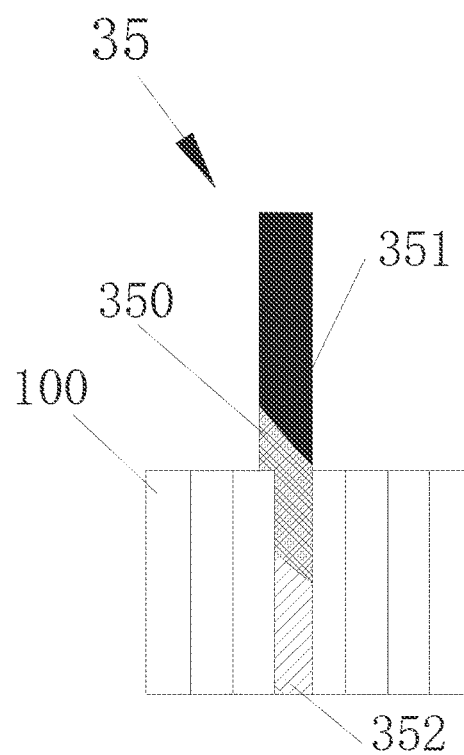
FIG. 11D is an enlarged view illustrating a connection of the cell strings in the third and fourth regions shown in FIG. 11 with a double-sided flexible conductive tape 35, wherein the double-sided flexible conductive tape 35 includes an upper conductive layer 351, a lower conductive layer 352 and an intermediate insulating layer 350 therebetween; the upper conductive layer 351 is connected with the cell strings in the fourth region, and the lower conductive layer 352 is connected with the cell strings in the first region; and the upper conductive layer 351 and the lower conductive layer 352 are overlapped, and are separated by the intermediate insulating layer 350 therebetween.

FIG. 11 illustrates a front schematic view of a shingled module designed according to the present invention. A negative electrode of a first region is electrically connected with a positive electrode of a second region through a flexible conductive tape 32 directly. A negative electrode of the second region is electrically connected with a positive electrode of a third region through a flexible conductive tape 33 directly. A negative electrode of the third region is electrically connected with a positive electrode of a fourth region through a flexible conductive tape 34 directly. The negative electrodes of each cell string in the fourth region and the positive electrodes of each cell string in the first region are respectively connected and insulated from each other through a double-sided flexible conductive tape 35.

Figure 15:
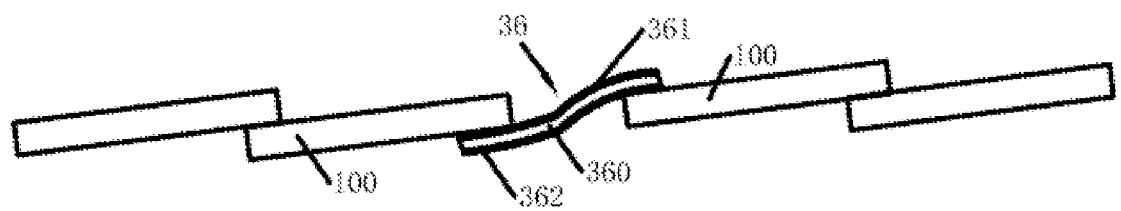
FIG. 15 is a side view of connecting the first region and the fourth region by a double-sided flexible conductive tape according to an embodiment of the present invention.
Figure 16:
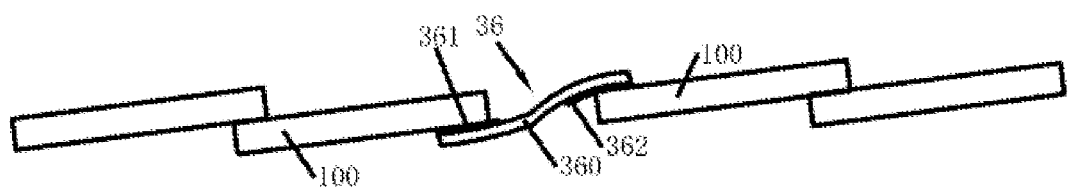
FIG. 16 is a side view of connecting the first region and the fourth region by another double-sided flexible conductive tape according to an embodiment of the present invention.
Figure 17:
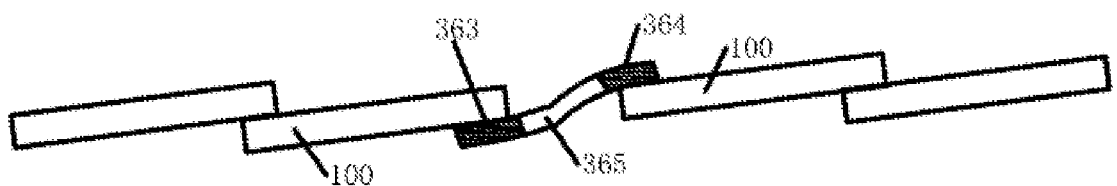
FIG. 17 is a side view of connecting the first region and the fourth region by a third double-sided flexible conductive tape according to an embodiment of the present invention.

FIGS. 15 to 17 illustrate more solution designs for connecting through a double-sided flexible conductive tape. Referring to FIG. 15, a flexible tape 36 is employed, wherein the flexible tape 36 includes an intermediate insulating layer 360 as well as a first conductive layer 361 and a second conductive layer 362 arranged on upper and lower sides of the intermediate insulating layer 360. A positive electrode of a first region is electrically connected with the first conductive layer 361. A negative electrode of a fourth region is electrically connected with the second conductive layer 362. Referring to FIG. 16, the difference from FIG. 15 is that the first conductive layer 361 and the second conductive layer 362 do not completely cover the intermediate insulating layer 360. Referring to FIG. 17, the difference from FIG. 15 is that negative electrodes of each cell string in the fourth region are connected through a second conductor 364 of a double double-sided flexible conductive tape, and positive electrodes of each cell string in the first region are connected through a first conductor 363 of the double-sided conductive tape. The first conductor 363 and the second conductor 364 are separated and insulated by an intermediate insulator 365. The intermediate insulator 365 is made of a polyethylene glycol terephthalate.

The negative electrodes of each cell string in the fourth region and the positive electrodes of each cell string in the first region may also be respectively connected through two independent conductive tapes, and the two conductive tapes are overlapped with each other with an insulating strip interposed therebetween, as shown in FIG. 12. The negative electrodes of each cell string in the fourth region and the positive electrodes of each cell string in the first region may also be respectively connected through two independent conductive tapes, the two conductive tapes are arranged side by side, and a gap therebetween is filled with an insulating packaging material such as an ethylene-vinyl acetate copolymer, as shown in FIG. 13.

What is claimed is:

1. A shingled photovoltaic module with bypass diodes, comprising: four regions including a first region, a second region, a third region, and a fourth region, and a double-sided flexible conductive tape electrically connecting the first region to the fourth region, the double-sided flexible conductive tape overlapping an edge of the first region, an edge of the fourth region, and a gap between the first region and the fourth region; wherein the four regions are arranged in a four-square shape; each region includes a plurality of solar cell strings consisting of crystalline silicon solar cells or crystalline silicon solar slice cells overlapped end to end; cell strings in each region are connected in parallel; and positive electrodes of the cell strings within each region are connected to each other, and negative electrodes of the cell strings within each region are connected to each other;

the positive electrodes of the cell strings in the first region serve as a positive electrode of the shingled photovoltaic module, and the negative electrodes of the cell strings in the first region are connected to the positive electrodes of the cell strings in the second region; the negative electrodes of the cell strings in the second region are connected to the positive electrodes of the cell strings in the third region; the negative electrodes of the cell strings in the third region are connected to the positive electrodes of the cell strings in the fourth region; and the negative electrodes of the cell strings in the fourth region serve as a negative electrode of the shingled photovoltaic module; and a first bypass diode is arranged between the positive electrodes of the cell strings in the first region and the negative electrodes of the cell strings in the second region, a positive electrode of the first bypass diode is connected with the negative electrodes of the cell strings in the second region, and a negative electrode of the first bypass diode is connected with the positive electrodes of the cell strings in the first region; a second bypass diode is arranged between the positive electrodes of the cell strings in the third region and the negative electrodes of the cell strings in the fourth region, a negative electrode of the second bypass diode is connected with the positive electrodes of the cell strings in the third region, and a positive electrode of the second bypass diode is connected with the negative electrodes of the cell strings in the fourth region; and wherein the double-sided flexible conductive tape includes a first conductive layer, a second conductive layer, and an intermediate insulating layer, the first conductive layer is arranged on and covering an upper side of the intermediate insulating layer, and the second conductive layer is arranged on and covering a lower side of the intermediate insulating layer; and wherein at least one electrode of the cell strings is connected to the first conductive layer and at least one electrode of the cell strings is connected to the second conductive layer.

2. The shingled photovoltaic module with bypass diodes according to claim 1, wherein each region comprises N solar cell strings, N is a positive integer, and 1≤N≤8; each cell string comprises M solar cells, M is a positive integer, 5≤M≤50; and solar cells in a same cell string have a same specification.

3. The shingled photovoltaic module with bypass diodes according to claim 1, wherein the solar cells constituting the cell strings are complete pieces of monocrystalline silicon or polycrystalline silicon solar cells, or small cell slices cut from a complete piece of solar cell.

4. The shingled photovoltaic module with bypass diodes according to claim 1, wherein a first junction box is arranged between the first region and the fourth region on a back side of the shingled photovoltaic module; and a positive electrode cable and a negative electrode cable of the shingled photovoltaic module are led out from the first junction box.

5. The shingled photovoltaic module with bypass diodes according to claim 4, wherein a second junction box is arranged in a middle region among the first region, the second region, the third region and the fourth region at the back side of the shingled photovoltaic module, and the first bypass diode and the second bypass diode are arranged in the second junction box; or the second junction box and a third junction box are arranged in the middle region among the first region, the second region, the third region and the fourth region at the back side of the shingled photovoltaic module, the first bypass diode is arranged in the second junction box, and the second bypass diode is arranged in the third junction box.

6. The shingled photovoltaic module with bypass diodes according to claim 4, wherein the first bypass diode and the second bypass diode are embedded in upper and lower insulating packaging materials of the shingled photovoltaic module, or arranged between the packaging material and a back plate, between the packaging material and a front plate, or between the packaging material and a cell slice.

7. The shingled photovoltaic module with bypass diodes according to claim 1, wherein the first bypass diode and the second bypass diode are embedded in upper and lower insulating packaging materials of the shingled photovoltaic module, or arranged between the packaging material and a back plate, between the packaging material and a front plate, or between the packaging material and a cell slice.

8. The shingled photovoltaic module with bypass diodes according to claim 1, wherein a negative electrode of the first region and a positive electrode of the second region are electrically connected with a first string connector through a metallic solder strip or an alloy solder strip; a negative electrode of the second region and a positive electrode of the third region are electrically connected with a second string connector through a first solder strip; a negative electrode of the third region and a positive electrode of the fourth region are electrically connected with a third string connector through a second solder strip; a negative electrode of the fourth region is electrically connected with the second conductive layer through a third solder strip; a positive electrode of the first region is electrically connected with the first conductive layer through a fourth solder strip; the first string connector, the second string connector, the third string connector, the second conductive layer, and the first conductive layer are made of a metal or an alloy; or the second conductive layer and the first conductive layer are arranged side by side and the gap therebetween is filled with an insulating packaging material.

9. The shingled photovoltaic module with bypass diodes according to claim 1, wherein a negative electrode of the first region is electrically connected with a positive electrode of the second region through a first flexible conductive tape directly; a negative electrode of the second region is electrically connected with a positive electrode of the third region through a second flexible conductive tape directly; and a negative electrode of the third region is electrically connected with a positive electrode of the fourth region through a third flexible conductive tape directly.

10. The shingled photovoltaic module with bypass diodes according to claim 9, wherein the negative electrodes of each cell string in the fourth region are connected through the second conductive layer of the double-sided flexible conductive tape, the positive electrodes of each cell string in the first region are connected by the first conductive layer of the double-sided flexible conductive tape, and the first conductive layer and the second conductive layer are isolated and insulated by the intermediate insulating layer.

11. The shingled photovoltaic module with bypass diodes according to claim 1, wherein the first bypass diode and the second bypass diode are located in a middle of the shingled photovoltaic module.

12. The shingled photovoltaic module with bypass diodes according to claim 1, wherein the at least one electrode of the cell strings connected to the first conductive layer is the positive electrode of the first region and the at least one electrode of the cell strings connected to the second conductive layer is the negative electrode of the fourth region.

* * * * *